United States Patent
Gao

(10) Patent No.: US 9,691,824 B2
(45) Date of Patent: Jun. 27, 2017

(54) OLED PANEL, MANUFACTURING METHOD THEREOF AND DISPLAY DEVICE

(71) Applicant: BOE TECHNOLOGY GROUP CO., LTD., Beijing (CN)

(72) Inventor: Xinwei Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/906,469

(22) PCT Filed: Apr. 14, 2015

(86) PCT No.: PCT/CN2015/076518
§ 371 (c)(1),
(2) Date: Jan. 20, 2016

(87) PCT Pub. No.: WO2016/119315
PCT Pub. Date: Aug. 4, 2016

(65) Prior Publication Data
US 2016/0372521 A1 Dec. 22, 2016

(30) Foreign Application Priority Data

Jan. 28, 2015 (CN) .......................... 2015 1 0043647

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC .............. *H01L 27/32* (2013.01); *H01L 51/52* (2013.01); *H01L 51/5246* (2013.01); *H01L 51/56* (2013.01)

(58) Field of Classification Search
CPC ...... H01L 27/32; H01L 51/5246; H01L 51/56
See application file for complete search history.

(56) References Cited

U.S. PATENT DOCUMENTS 6,614,057 B2* 9/2003 Silvernail ............. H01L 25/046
257/100
6,791,660 B1* 9/2004 Hayashi .............. B81C 1/00269
349/153

(Continued)

FOREIGN PATENT DOCUMENTS

| CN | 102231427 A | 11/2011 |
| CN | 103337511 A | 10/2013 |

(Continued)

OTHER PUBLICATIONS

International Search Report dated Oct. 21, 2015 corresponding to International application No. PCT/CN2015/076518.

(Continued)

*Primary Examiner* — William Coleman
(74) *Attorney, Agent, or Firm* — Nath, Goldberg & Meyer; Joshua B. Goldberg

(57) ABSTRACT

The present invention provides an OLED panel, a manufacturing method thereof and a display device. The OLED panel includes a substrate, an OLED light emitting unit that is provided on the substrate and a cover plate that is provided above the OLED light emitting unit, wherein a frit is provided in an area between the cover plate and the substrate corresponding to and surrounding a periphery of the light emitting unit, the frit being used for bonding the cover plate and the substrate together so as to hermetically package the OLED light emitting unit, and a supplementary packaging structure is further provided in an area between the cover plate and the substrate corresponding to a periphery of the frit, the supplementary packaging structure being used for assisting the frit to package the OLED light emitting unit and support the cover plate and the substrate.

13 Claims, 3 Drawing Sheets

(56) References Cited

U.S. PATENT DOCUMENTS

| | | | | |
|---|---|---|---|---|
| 6,831,725 | B2* | 12/2004 | Niiya | G02F 1/1339 |
| | | | | 349/153 |
| 7,821,197 | B2* | 10/2010 | Lee | H01L 51/5246 |
| | | | | 313/504 |
| 8,415,880 | B2* | 4/2013 | Choi | C03C 8/24 |
| | | | | 313/512 |
| 8,957,410 | B2* | 2/2015 | Xiong | H01L 51/5246 |
| | | | | 257/40 |
| 9,239,497 | B2* | 1/2016 | Ishitani | G02F 1/1341 |
| 9,281,132 | B2* | 3/2016 | Logunov | H01G 9/2077 |
| 9,281,494 | B2* | 3/2016 | Lee | H01L 27/3276 |

FOREIGN PATENT DOCUMENTS

| | | |
|---|---|---|
| CN | 103367658 A | 10/2013 |
| CN | 103579294 A | 2/2014 |
| CN | 203850302 U | 9/2014 |
| CN | 104241542 A | 12/2014 |
| CN | 204332962 U | 5/2015 |

OTHER PUBLICATIONS

Written Opinion of the International Searching Authority dated Oct. 21, 2015 corresponding to International application No. PCT/CN2015/076518.

\* cited by examiner

OLED PANEL, MANUFACTURING METHOD THEREOF AND DISPLAY DEVICE

This is a National Phase Application filed under 35 U.S.C. 371 as a national stage of PCT/CN2015/076518, filed Apr. 14, 2015, an application claiming the benefit of Chinese Application No. 201510043647.7, filed Jan. 28, 2015, the content of each of which is hereby incorporated by reference in its entirety.

FIELD OF THE INVENTION

The present invention relates to the field of display technology, and in particular, to an OLED panel, a manufacturing method thereof and a display device.

BACKGROUND OF THE INVENTION

An OLED (Organic Light-Emitting Diode) Panel has excellent characteristics such as ultra-thin, low cost, low power consumption, wide angle of view, all-solid state, self-luminous, low driving voltage and capability of flexible display, and is becoming a promising new generation flat display technique.

The OLED panel is a display device in which a luminescent material is driven by a current to emit light independently. Well packaging is critical to service life and display quality of the OLED panel, and this is because the luminescent material is quite sensitive to temperature, air and moisture.

Currently, the packaging for middle and small sized OLED products involves packaging the products by using a packaging adhesive such as a frit. As shown in FIG. 1, a frit 3 is melted by irradiation of laser beams, and the frit 3 is then cured, such that a cover glass 5 and a substrate glass 6 are bonded together and the packaging is realized.

However, due to limitations on factors such as process conditions and requirements on products, the width and height of the frit after completing the packaging of the OLED panel are limited. Meanwhile, the frit itself is a glass material, and it tends to be cracked and generate fine cracks when subjected to an external force such as a stress between a substrate glass and a cover glass, resulting in air leakage, so that the packaging result of the OLED panel is severely degraded.

SUMMARY OF THE INVENTION

In view of the above technical problems in the prior art, embodiments of the present invention provide an OLED panel, a manufacturing method thereof and a display device. According to the OLED panel, by providing a supplementary packaging structure, which can assist a frit to double-layer-package an OLED light emitting unit, the packaging result of the OLED panel can be improved effectively; meanwhile, the supplementary packaging structure can assist the frit to support a cover plate and a substrate, so that the frit tending to be cracked under a stress between the cover plate and the substrate can be alleviated effectively, which in turn improves the packaging quality of the OLED panel.

An embodiment of the present invention provides an OLED panel, which includes a substrate, an OLED light emitting unit that is provided on the substrate and a cover plate that is provided above the OLED light emitting unit, wherein a frit is provided in an area between the cover plate and the substrate corresponding to and surrounding a periphery of the light emitting unit, the frit being used for bonding the cover plate and the substrate together so as to hermetically package the OLED light emitting unit, and a supplementary packaging structure is further provided in an area between the cover plate and the substrate corresponding to a periphery of the frit, the supplementary packaging structure being used for assisting the frit to package the OLED light emitting unit and support the cover plate and the substrate.

The supplementary packaging structure may include a recess provided on a surface of the cover plate facing the OLED light emitting unit, and the supplementary packaging structure may further include an UV adhesive, the UV adhesive being provided in an area between a bottom of the recess and a part of a surface of the substrate corresponding to the recess, and the UV adhesive being bonded with the bottom of the recess and the substrate, respectively.

A depth of the recess may be smaller than a thickness of the cover plate.

A width of the recess in a direction away from the OLED light emitting unit may be equal to or less than a distance between a side of the frit away from the OLED light emitting unit and an edge of the cover plate corresponding to the side.

The UV adhesive may surround the whole periphery of the frit and is bonded with the frit.

The UV adhesive may be provided at peripheries of two opposite sides of the frit and is bonded with the frit.

The UV adhesive may be provided at outside of each center of four sides of the frit respectively and is bonded with the frit.

An embodiment of the present invention further provides a display device, which includes the above described OLED panel.

An embodiment of the present invention further provides a manufacturing method of an OLED panel, which includes:

forming an OLED light emitting unit on a substrate;

forming a frit on a cover plate;

making a surface of the substrate with the OLED light emitting unit formed thereon and a surface of the cover plate with the frit formed thereon face to each other, and assembling the substrate with the cover plate, such that the frit is provided in an area corresponding to and surrounding a periphery of the OLED light emitting unit; and sintering the frit.

The method further includes packaging a periphery of the frit between the cover plate and the substrate by a supplementary packaging structure.

The supplementary packaging structure includes a recess and an UV adhesive. The packaging a periphery of the frit between the cover plate and the substrate by a supplementary packaging structure may include:

before forming the frit on the substrate, forming the recess on a surface of the cover plate facing the OLED light emitting unit;

after sintering the frit, injecting the UV adhesive into a gap between the recess and the substrate at the periphery of the frit; and curing the UV adhesive.

According to the technical solutions of the OLED panel provided by Embodiments of the present invention, by providing the supplementary packaging structure, it is possible to assist the frit to double-layer-package the OLED light emitting unit, so that the packaging result of the OLED panel is improved effectively. Meanwhile, it is possible to assist the frit to support the cover plate and the substrate, so that the frit tending to be cracked under the stress between the cover plate and substrate can be alleviated effectively, which in turn improves the packaging quality of the OLED panel.

According to the technical solution of the display device, by adopting the above described OLED panel, the packaging result of the display device is improved and the quality of the display device is also improved.

DETAILED DESCRIPTION OF THE EMBODIMENTS

To make those skilled in the art better understand the technical solutions of the present invention, an OLED panel, a manufacturing method thereof and a display device provided by the present invention will be further described in details in conjunction with the accompanying drawings and specific embodiments.

Embodiment 1

Figure 1:
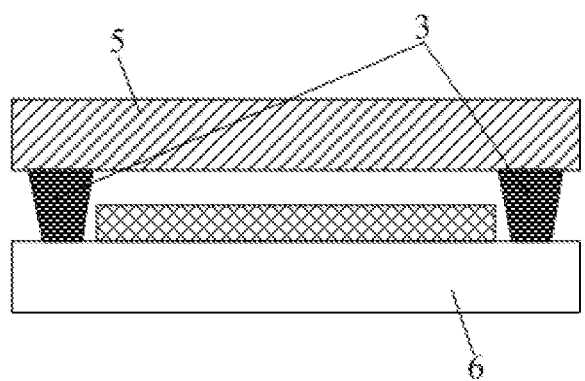
FIG. 1 is a structural section view of an OLED panel along a direction vertical to a surface thereof in the prior art.
Figure 2:
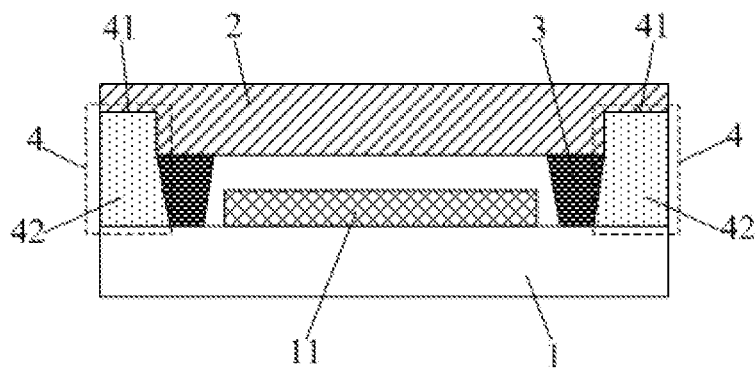
FIG. 2 is a structural section view of an OLED panel along a direction vertical to a surface thereof in Embodiment 1 of the present invention.

The present embodiment provides an OLED panel, as shown in FIG. 2, the OLED panel includes a substrate 1; an OLED light emitting unit 11 that is provided on the substrate 1; and a cover plate 2 that is provided above the OLED light emitting unit 11, wherein a frit 3 is provided in an area between the cover plate 2 and the substrate 1 corresponding to and surrounding a periphery of the OLED light emitting unit 11, and the frit 3 is used for bonding the cover plate 2 and the substrate 1 together so as to hermetically package the OLED light emitting unit 11. A supplementary packaging structure 4 is further provided in an area between the cover plate 2 and the substrate 1 corresponding to a periphery of the frit 3, and the supplementary packaging structure 4 is used for assisting the frit 3 to package the OLED light emitting unit 11 and support the cover plate 2 and substrate 1.

By providing the supplementary packaging structure 4, it is possible to assisting the frit 3 to double-layer-package the OLED light emitting unit 11, so that the packaging result of the OLED panel is improved effectively. Meanwhile, it is possible to assist the frit 3 to support the cover plate 2 and the substrate 1, so that the frit 3 tending to be cracked under the stress between the cover plate 2 and the substrate 1 can be alleviated effectively, which in turn improves the packaging quality of the OLED panel.

In the present embodiment, the supplementary packaging structure 4 includes a recess 41 provided on a surface of the cover plate 2 facing the OLED light emitting unit 11. The supplementary packaging structure 4 further includes an UV adhesive 42 that is provided in an area between the bottom of the recess 41 and a part of a surface of the substrate 1 corresponding to the recess 41, and the UV adhesive 42 is bonded with the bottom of the recess 41 and the substrate 1, respectively.

The recess 41 is provided such that the thickness of the UV adhesive 42 provided between the bottom of the recess 41 and the substrate 1 is larger than the thickness of the frit 3 provided between the cover plate 2 and the substrate 1, so that the stress between the cover plate 2 and the substrate 1 will be applied onto the UV adhesive 42 first, buffered by the UV adhesive 42 and then applied onto the frit 3, thereby the frit 3 tending to be cracked under the stress being alleviated effectively, which in turn improves the packaging quality and result of the OLED panel. In addition, by providing the recess 41, a distance between the cover plate 2 and substrate 1 corresponding to the recess 41 is increased, so that the UV adhesive can be injected into a gap between the cover plate 2 and the substrate 1 more easily, which in turn makes the bonding of the UV adhesive 42 at an area between the cover plate 2 and the substrate 1 corresponding to the recess 41 stronger, thereby improving the result of the packaging.

The depth of the recess 41 is less than the thickness of the cover plate 2. As the recess 41 is provided on the surface of the cover plate 2, the ability of the UV adhesive 42 bonded with the bottom of the recess 41 to support the cover plate 2 can be guaranteed as long as the depth of the recess 41 is less than the thickness of the cover plate 2, which in turn guarantees that the UV adhesive 42 can buffer the stress applied thereon from the cover plate 2, so that the stress is prevented from directly applying onto the frit 3 and leading to the crack of the frit 3.

Figure 3:
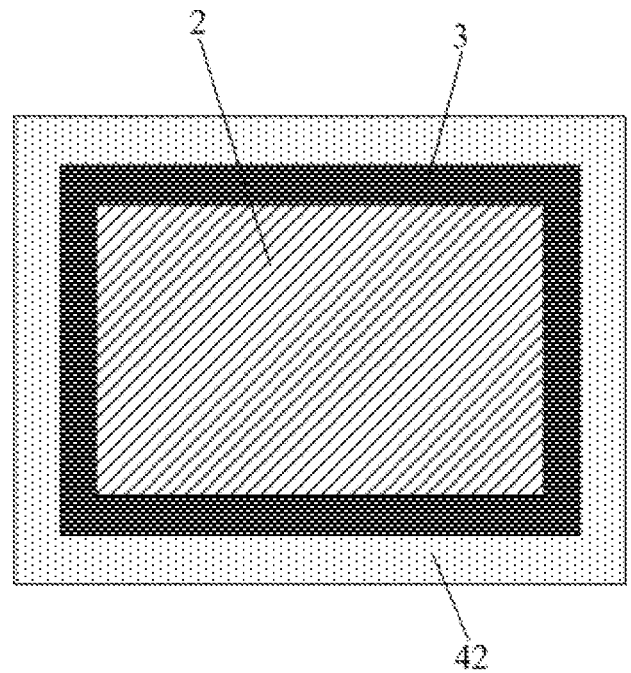
FIG. 3 is a structural section view of the OLED panel in FIG. 2 along a direction parallel to the surface thereof.

In the present embodiment, the width of the recess 41 in a direction away from the OLED light emitting unit 11 is equal to or less than a distance between a side of the frit 3 away from the OLED light emitting unit 11 and an edge of the cover plate 2 corresponding to the side. That is, the width of the recess 41 is equal to or less than the minimum straight-line distance between an outer side of the frit 3 and the edge of the cover plate 2. In this case, the UV adhesive 42 can assist the packaging of the frit 3 that packages the OLED light emitting unit 11 as long as the UV adhesive 42 is bonded with the recess 41 on the cover plate 2. In the present embodiment, as shown in FIG. 3, the UV adhesive 42 surrounds the whole periphery of the frit 3 and is bonded with the frit 3. That is, the UV adhesive 42 is distributed in the periphery of the frit 3 continuously and forms a closed loop. In such a way, it can be ensured that the UV adhesive 42 better supports the peripheries of the cover plate 2 and substrate 1, so that the frit 3 tending to be cracked can be alleviated.

In the present embodiment, the shape of a longitudinal section of the recess 41 in a direction vertical to its length direction may be a rectangle, semicircle, semi-ellipse, triangle or trapezoid. However, the longitudinal section of the recess is not limited to these shapes and it may be any shapes as long as the distance between the bottom of the recess 41 and the surface of the substrate 1 is larger than the distance between the opposite surfaces of the cover plate 2 and substrate 1.

Based on above structures of the OLED panel in the present embodiment, the present embodiment further provides a manufacturing method of the OLED panel, which includes the following steps of S1 to S4.

At step S1, an OLED light emitting unit is formed on a substrate.

In this step, the OLED light emitting unit is formed on the substrate by means of vacuum evaporation, inkjet printing, spin coating, or the like.

At step S2, a frit is formed on a cover plate.

In this step, a frit in a liquid state is formed on the cover plate by means of screen printing or the like, and then the frit in the liquid state is cured by means of sintering.

At step S3, a surface of the substrate with the OLED light emitting unit formed thereon and a surface of the cover plate with the frit formed thereon are faced to each other, and then the substrate and the cover plate are assembled together in such a way that the frit is provided in an area corresponding to and surrounding a periphery of the OLED light emitting unit.

At step S4, the frit is sintered.

In this step, the frit formed on the cover plate is melted by irradiation of laser, and then the melted frit is cured again by means of sintering, such that the cover plate and the substrate are bonded together.

In the present embodiment, the method further includes packaging a periphery of the frit between the cover plate and the substrate by means of a supplementary packaging structure.

The supplementary packaging structure may include a recess and an UV adhesive. The step of packaging a periphery of the frit between the cover plate and the substrate by means of a supplementary packaging structure may include the following steps of S11 to S13.

At step S11, before forming the frit on the cover plate (i.e., step S2), a recess is formed on a surface of the cover plate facing the OLED light emitting unit.

In this step, the recess is formed on the cover plate by a patterning process or grinding process. The patterning process may include the following steps of applying a photoresist layer on the cover plate, exposing the photoresist by using a mask with a pattern of the recess, removing the photoresist corresponding to the pattern of the recess by developing, and finally etching a portion of the cover plate without protection of photoresist through hydrofluoric acid, so as to form the recess. On the other hand, the grinding process is a process for grinding an area on the surface of the cover plate where the recess is to be formed through a grinding machine to form the recess.

At step S12, an UV adhesive is injected into a gap between the recess and the substrate at the periphery of the frit.

At step S13, the UV adhesive is cured.

To this end, the preparation of the OLED panel is completed.

Embodiment 2

Figure 4:
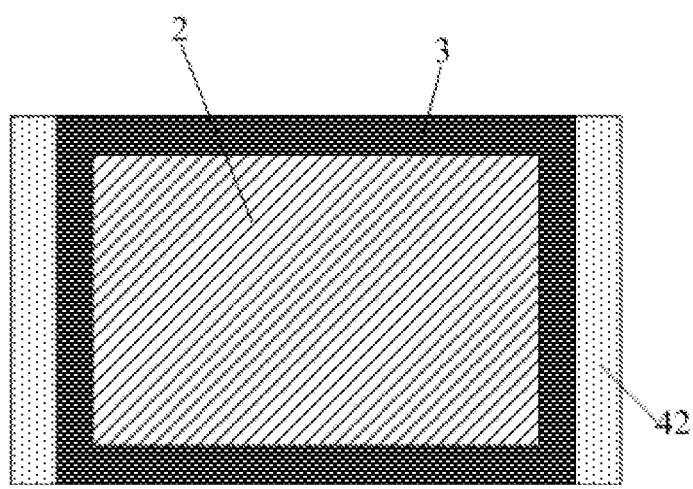
FIG. 4 is a structural section view of an OLED panel along a direction parallel to a surface thereof in Embodiment 2 of the present invention.

The present embodiment provides an OLED panel, which differs from that of Embodiment 1 in that the UV adhesive 42 is provided at peripheries of two opposite sides of the frit 3, and is bonded with the frit 3, as shown in FIG. 4.

The above arrangement of the UV adhesive 42 can guarantee that the UV adhesive 42 can support the peripheries of the two opposite sides of the frit 3 between the cover plate 2 and the substrate 1. Compared to Embodiment 1, although the UV adhesive 42 only support the peripheries of the two opposite sides of the frit 3 between the cover plate 2 and the substrate 1, a well support can be guaranteed to be formed between the whole cover plate 2 and the substrate 1, so that the crack of the frit 3 can be alleviated. In addition, the arrangement manner of the UV adhesive 42 in the present embodiment can also make the frames at the other two sides of the OLED touch panel where the UV adhesive is not disposed narrower, so that the display performance of the OLED panel can be improved and the packaging result of the OLED panel can be ensured.

Other structures of the OLED panel in the present embodiment and the manufacturing method thereof are the same as those in Embodiment 1, and will not be redundantly described herein.

Embodiment 3

Figure 5:
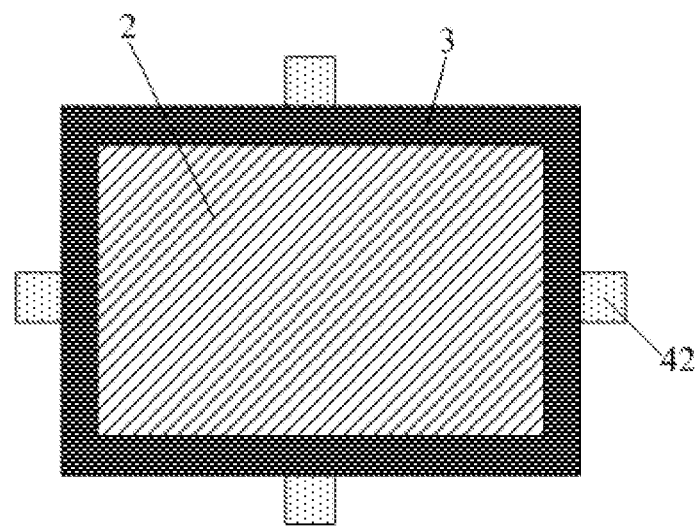
FIG. 5 is a structural section view of an OLED panel along a direction parallel to a surface thereof in Embodiment 3 of the present invention.

The present embodiment provides an OLED panel, which differs from Embodiments 1 and 2 in that the UV adhesive 42 is provided at outside of each center of four sides of the frit 3, respectively, and is bonded with the frit 3, as shown in FIG. 5.

The above arrangement of the UV adhesive 42 can guarantee that the UV adhesive 42 can support the outside of each center of four sides of the frit 3 between the cover plate 2 and the substrate 1. Compared to Embodiments 1 and 2, although the UV adhesive 42 only support the outside of each center of four sides of the frit 3 between the cover plate 2 and the substrate 1, a well support can be guaranteed to be formed between the whole cover plate 2 and the substrate 1, so that the crack of the frit 3 can be alleviated. In addition, the arrangement manner of the UV adhesive 42 in the present embodiment can make the frames at the area of the OLED touch panel where the UV adhesive is not disposed narrower, so that the display performance of the OLED panel can be improved and the packaging result of the OLED panel can be ensured.

Other structures of the OLED panel in the present embodiment and the manufacturing method thereof are the same as those in Embodiment 1 or 2, and will not be redundantly described herein.

According to the OLED panel provided in Embodiments 1 to 3, by providing the supplementary packaging structure, it is possible to assist the frit to double-layer-package the OLED light emitting unit, so that the packaging result of the OLED panel is improved effectively. Meanwhile, it is possible to assist the frit to support the cover plate and the substrate, so that the frit tending to be cracked under the stress between the cover plate and substrate can be alleviated effectively, which in turn improves the packaging quality of the OLED panel.

Embodiment 4

The present embodiment provides a display device, including the OLED panel according to any one of Embodiments 1 to 3.

By adopting the OLED panel according to any one of Embodiments 1 to 3, the packaging result of the display device is improved and the quality of the display device is also improved.

The display device provided by the present invention may be any product or part with OLED display function, such as an OLED panel, an OLED television, an OLED display, an OLED mobile phone, an OLED navigator and the like.

It can be understood that the foregoing implementations are merely the exemplary embodiments used for explaining the principle of the present invention, but the present invention is not limited thereto. Various modifications and improvements can be made for those skilled in the art without departing from the spirit and essence of the present invention, and these modifications and improvements shall also fall within the protection scope of the present invention.

What is claimed is:

1. An OLED panel, which includes a substrate, an OLED light emitting unit that is provided on the substrate and a cover plate that is provided above the OLED light emitting unit, wherein
   a frit is provided in an area between the cover plate and the substrate corresponding to and surrounding a periphery of the light emitting unit, the frit being used for bonding the cover plate and the substrate together so as to hermetically package the OLED light emitting unit,
   a supplementary packaging structure is further provided in an area between the cover plate and the substrate corresponding to a periphery of the frit, the supplementary packaging structure being used for assisting the frit to package the OLED light emitting unit and support the cover plate and the substrate, and
   wherein the supplementary packaging structure includes a recess provided on a surface of the cover plate facing the OLED light emitting unit, a side of the recess away from the OLED light emitting unit being open, and the supplementary packaging structure further includes an UV adhesive, the UV adhesive being provided in an area between a bottom of the recess and a part of a surface of the substrate corresponding to the recess, and the UV adhesive being bonded with the bottom of the recess and the substrate, respectively.

2. The OLED panel according to claim 1, wherein a depth of the recess is smaller than a thickness of the cover plate.

3. The OLED panel according to claim 1, wherein a width of the recess in a direction away from the OLED light emitting unit is equal to or less than a distance between a side of the frit away from the OLED light emitting unit and an edge of the cover plate corresponding to the side.

4. The OLED panel according to claim 1, wherein the UV adhesive surrounds the whole periphery of the frit and is bonded with the frit.

5. The OLED panel according to claim 1, wherein the UV adhesive is provided at peripheries of two opposite sides of the frit and is bonded with the frit.

6. The OLED panel according to claim 1, wherein the UV adhesive is provided at outside of each center of four sides of the frit respectively and is bonded with the frit.

7. A display device, which includes an OLED panel including a substrate, an OLED light emitting unit that is provided on the substrate and a cover plate that is provided above the OLED light emitting unit, wherein
   a frit is provided in an area between the cover plate and the substrate corresponding to and surrounding a periphery of the light emitting unit, the frit being used for bonding the cover plate and the substrate together so as to hermetically package the OLED light emitting unit,
   a supplementary packaging structure is further provided in an area between the cover plate and the substrate corresponding to a periphery of the frit, the supplementary packaging structure being used for assisting the frit to package the OLED light emitting unit and support the cover plate and the substrate, and
   wherein the supplementary packaging structure includes a recess provided on a surface of the cover plate facing the OLED light emitting unit, a side of the recess away from the OLED light emitting unit being open, and the supplementary packaging structure further includes an UV adhesive, the UV adhesive being provided in an area between a bottom of the recess and a part of a surface of the substrate corresponding to the recess, and the UV adhesive being bonded with the bottom of the recess and the substrate, respectively.

8. The display device according to claim 7, wherein a depth of the recess is smaller than a thickness of the cover plate.

9. The display device according to claim 7, wherein a width of the recess in a direction away from the OLED light emitting unit is equal to or less than a distance between a side of the frit away from the OLED light emitting unit and an edge of the cover plate corresponding to the side.

10. The display device according to claim 7, wherein the UV adhesive surrounds the whole periphery of the frit and is bonded with the frit.

11. The display device according to claim 7, wherein the UV adhesive is provided at peripheries of two opposite sides of the frit and is bonded with the frit.

12. The display device according to claim 4, wherein the UV adhesive is provided at outside of each center of four sides of the frit respectively and is bonded with the frit.

13. A manufacturing method of an OLED panel, which includes:
   forming an OLED light emitting unit on a substrate;
   forming a frit on a cover plate;
   making a surface of the substrate with the OLED light emitting unit formed thereon and a surface of the cover plate with the frit formed thereon face to each other, and assembling the substrate with the cover plate, such that the frit is provided in an area corresponding to and surrounding a periphery of the OLED light emitting unit; and
   sintering the frit, wherein
   the method further includes packaging a periphery of the frit between the cover plate and the substrate by a supplementary packaging structure, wherein
   the supplementary packaging structure includes a recess and an UV adhesive, a side of the recess away from the OLED light emitting unit being open, and
   the packaging a periphery of the frit between the cover plate and the substrate by a supplementary packaging structure includes:
   before forming the frit on the substrate, forming the recess on a surface of the cover plate facing the OLED light emitting unit;
   after sintering the frit, injecting the UV adhesive into a gap between the recess and the substrate at the periphery of the frit; and
   curing the UV adhesive.

* * * * *